(12) United States Patent
Cooper

(10) Patent No.: US 6,756,923 B1
(45) Date of Patent: Jun. 29, 2004

(54) DATA COMPRESSOR UTILIZING SWITCHED INPUT COINCIDENCE ELEMENTS ARRANGED IN VIRTUAL LEVELS

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 10/448,620

(22) Filed: May 30, 2003

(51) Int. Cl.$^7$ ............................................... H03M 7/34
(52) U.S. Cl. ........................................ 341/51; 341/67
(58) Field of Search .......................... 341/50, 51, 67, 341/63, 65

(56) References Cited

U.S. PATENT DOCUMENTS

| | | | | |
|---|---|---|---|---|
| 5,463,390 A | * | 10/1995 | Whiting et al. | 341/51 |
| 5,861,827 A | * | 1/1999 | Welch et al. | 341/51 |
| 5,951,623 A | * | 9/1999 | Reynar et al. | 708/203 |
| 6,169,499 B1 | * | 1/2001 | Cooper | 341/51 |
| 6,188,333 B1 | * | 2/2001 | Cooper | 341/51 |
| 6,307,488 B1 | * | 10/2001 | Cooper | 341/51 |
| 6,608,570 B1 | * | 8/2003 | Cooper | 341/51 |

* cited by examiner

Primary Examiner—Peguy JeanPierre

(74) Attorney, Agent, or Firm—Albert B. Cooper; Mark T. Starr

(57) ABSTRACT

A matrix of AND-gates correspond to respective codes to be assigned to strings. The outputs of the AND-gates are selectively coupled to prefix code inputs of the AND-gates through a prefix code matrix switch. A plurality of characters from the input stream are fetched into an input character buffer and applied through respective character decoders and selectively through a character matrix switch to character inputs of the AND-gates. An AND-gate corresponding to a code assigned to a string that is the longest match to the plurality of fetched characters is thereby enabled. An update extended string is recorded in the AND-gate corresponding to the next code to be assigned by coupling, through the prefix code matrix switch, the output of the AND-gate corresponding to the longest matching string to the prefix code input of the AND-gate corresponding to the next code to be assigned. The character decoder output representing the fetched character following the longest matching string is coupled, through the character matrix switch, to the character input of the AND-gate corresponding to the next code to be assigned. A virtual level is assigned to an AND-gate indicative of the number of characters of the string recorded by the AND-gate. The virtual level that is assigned to the AND-gate recording the update extended string is one greater than the level that had been assigned to the AND-gate corresponding to the longest match. The virtual level is also indicative of the stage of the input character buffer holding the character following the longest match.

23 Claims, 7 Drawing Sheets

Single Character String Processing

Multiple Character String Processing

DATA COMPRESSOR UTILIZING SWITCHED INPUT COINCIDENCE ELEMENTS ARRANGED IN VIRTUAL LEVELS

CROSS REFERENCE TO RELATED APPLICATIONS

U.S. patent application Ser. No. 09/951,263 "Data Compression Method And Apparatus Utilizing Cascaded Subdictionaries" by Cooper, filed Sep. 13, 2001 discloses a cascaded subdictionary arrangement for implementing LZ type compressors.

U.S. patent application Ser. No. 10/195,795 "Matrix Implemented Data Compression Apparatus and Method" by Cooper, filed Jul. 15, 2002, now U.S. Pat. No. 6,608,570, discloses a matrix implementation for LZ type compressors.

U.S. patent application Ser. No. 10/271,196 "Data Compression Apparatus and Method Utilizing Tandem Coupled Matrices" by Cooper, filed Oct. 15, 2002, discloses a tandem coupled matrix implementation for LZ type compressors.

U.S. patent application Ser. No. 10/351,210 "Data Compressor Utilizing Switched Input Coincidence Elements" by Cooper, filed Jan. 25, 2003, discloses a compressor similar to that of said Ser. No. 10/195,795 utilizing switched input coincidence elements.

Said Ser. No. 10/195,795; Ser. No. 10/271,196 and Ser. No. 10/351,210 are incorporated herein by reference.

BACKGROUND OF THE INVENTION

1. Field of the Invention

The invention relates to data compression systems based on the LZ data compression methodology and more particularly on the LZW protocols.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, 31 Jul., 1990. TIFF is a development of Aldus Corporation and the name TIFF is a Trademark thereof. Reference to the TIFF specification is found in TIFF, Revision 6.0, Final—June 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat No. 4,464,650 by Eastman et al., issued Aug. 7, 1984; U.S. Pat No. 4,814,746 by Miller et al., issued Mar. 21, 1989; U.S. Pat No. 4,876,541 by Storer, issued Oct. 24, 1989; U.S. Pat No. 5,153,591 by Clark, issued Oct. 6, 1992; U.S. Pat No. 5,373,290 by Lempel et al., issued Dec. 13, 1994; U.S. Pat No. 5,838,264 by Cooper, issued Nov. 17, 1998; U.S. Pat No. 5,861,827 by Welch et al., issued Jan. 19, 1999; U.S. Pat No. 6,188,333 by Cooper, issued Feb. 13, 2001; and U.S. Pat No. 6,320,523 by York et al., issued Nov. 20, 2001.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known searchtree architectures and protocols. Typically, the searchtree is arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as associative memory dictionaries, hashing and sibling lists as are well understood in the art.

In the above dictionary based systems, numerous iterative operations and dictionary accesses are required at the compressor for compressing an input stream of data characters. Normally an iteration including several dictionary accesses is required for each input data character and when utilizing an associative memory, it may be necessary to search the entire memory to determine if a string exists therein. It is desirable in such systems to minimize the number of iterative processes and dictionary accesses so as to enhance system performance.

Although the known dictionary architectures and protocols provide efficient data compression systems, it is a continuing objective in the art to improve compressor performance.

The data compressors of said Ser. No. 10/195,795; Ser. No. 10/271,196 and Ser. No. 10/351,210 provide an improvement over the prior art by replacing the known dictionary architecture by matrices of coincidence elements thereby eliminating dictionary accesses. Although, in said Ser. No. 10/195,795 and Ser. No. 10/351,210, dictionary accesses are eliminated, compressor iterations are utilized for processing sequentially fetched input characters. In said Ser. No. 10/271,196, although compressor iterations for processing sequentially fetched input characters are eliminated, the embodiments therein utilize a significant number of coincidence elements as do the embodiments of said Ser. No. 10/195,795.

SUMMARY OF THE INVENTION

The present invention replaces the conventional dictionary arrangements with digital logic elements and switches to provide a new architecture and protocols which, it is believed, will improve the performance of LZ type data compression systems. The embodiments of the present invention eliminate both dictionary accesses and compressor iterations for processing sequentially fetched input characters while utilizing significantly fewer coincidence elements than the embodiments of said Ser. No. 10/195,795 and Ser. No. 10/271,196. The embodiments of the present invention utilize a similar number of coincidence elements as the embodiments of said Ser. No. 10/351,210.

The present invention is embodied in a data compressor for compressing an input stream of data characters into an output stream of compressed codes. The compressor includes a plurality of coincidence elements corresponding to a respective plurality of codes to be assigned to strings. A string is comprised of a prefix string of at least one of the data characters followed by an extension character, a prefix string having a prefix code associated therewith. A coincidence element provides a coincidence output and has a prefix code input and a character input for enabling the coincidence element to energize the coincidence output thereof upon coincidental energization of the inputs so that energization of a coincidence output of a coincidence element provides a representation of the code corresponding thereto. The compressor further includes a first coupling arrangement for selectively coupling the provided representations of codes corresponding to the coincidence elements to the prefix code inputs of the coincidence elements and a second coupling arrangement for selectively coupling representations of data characters fetched from the input stream to the character inputs of the coincidence elements. A plurality of data characters fetched from the input stream is applied to the second coupling arrangement so as to enable a coincidence element corresponding to a code assigned to a string that is the longest match to the fetched plurality of data characters. The code of the longest matching string is output, thereby providing the stream of compressed codes.

In the preferred embodiments, an extended string comprising the prefix string having the code corresponding to the longest matching string and the extension character corresponding to the data character following the longest matching string is inserted into the compressor and assigned the next available code. The extended string is stored and the code assigned by coupling the representation of the code assigned to the longest matching string and the representation of the fetched data character following the longest matching string to the prefix code input and the character input, respectively, of the coincidence element corresponding to the next code to be assigned to a string.

DESCRIPTION OF THE PREFERRED EMBODIMENTS

Figure 1:
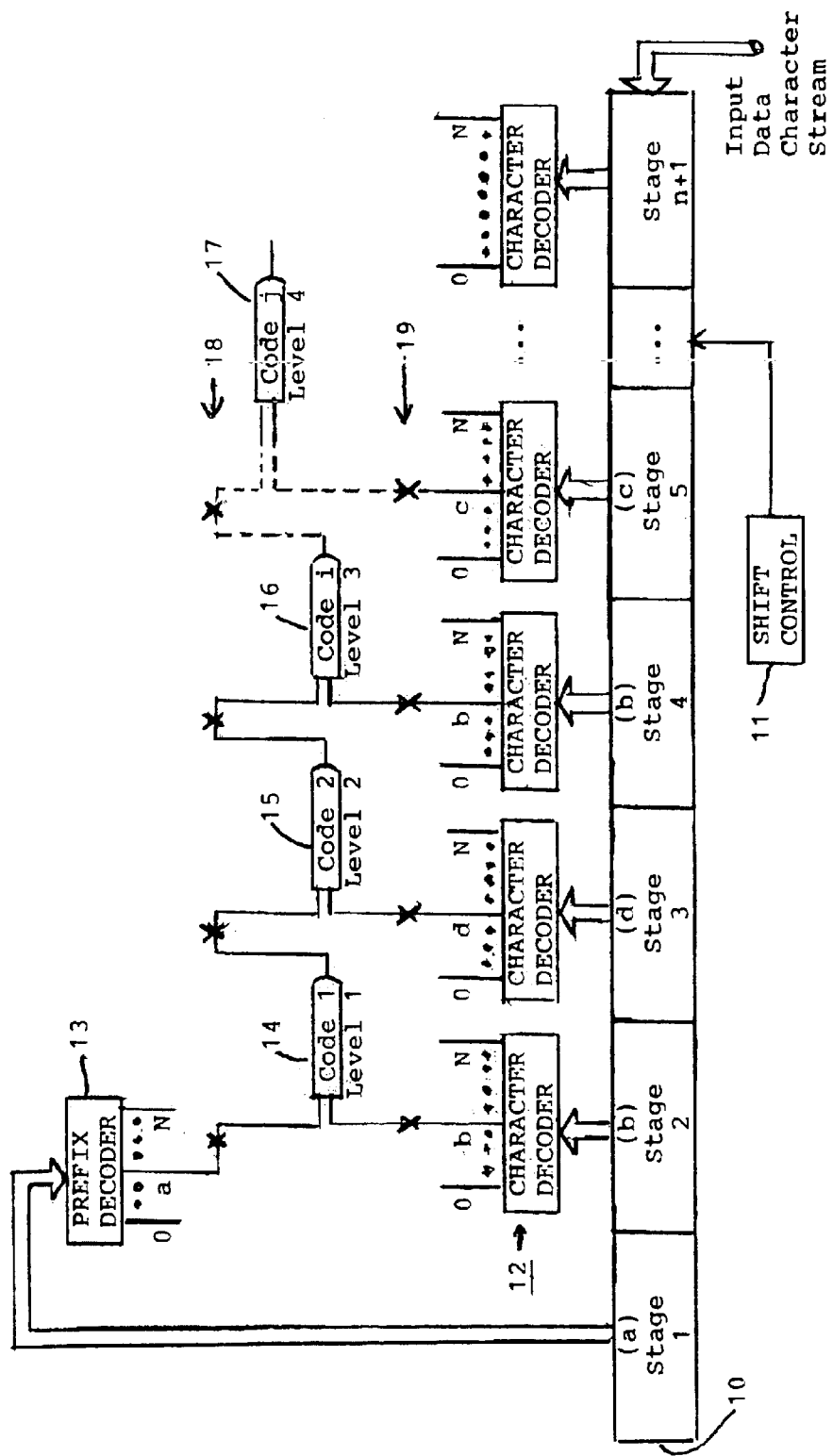
FIG. 1 is a schematic block diagram exemplifying principles of the present invention.

Referring to FIG. 1, a schematic block diagram exemplifying principles of the invention is provided. An input data character stream is shifted into an input character buffer 10 by a shift control 11. The buffer 10 is illustrated holding the consecutive characters "abdbc" (in parentheses) from the input stream in stages 1 through 5, respectively. Character decoders 12 coupled to respective buffer stages 2 through n+1 provide unique representations of the respective character values held in the buffer stages. A prefix decoder 13 coupled to buffer stage 1 provides a unique representation of the character value held in stage 1. It is appreciated that prefix decoder 13 is identical to each of the character decoders 12.

Two-input AND-gates 14 through 17 correspond to respective assignable string codes and are assigned virtual levels as illustrated. The AND-gates receive prefix code representations at the prefix code inputs thereof through switches 18 and character representations at the character inputs thereof through switches 19. For example, AND-gate 15 receives the prefix code representation from the output of AND-gate 14 and AND-gate 14 receives the prefix code representation from the prefix decoder 13. It is appreciated that the outputs of the prefix decoder 13 provide single character prefix code representations of the character values held in stage 1 of buffer 10. The switch connections in solid line have previously been established and the switch connections in dashed line will be established.

Strings previously encountered in the input data character stream are recorded in AND-gates 14–16. As illustrated, AND-gate 14 is storing the two-character string "ab" represented by string code 1; AND-gate 15 is storing the three-character string "abd" represented by string code 2 and AND-gate 16 is storing the four-character string "abdb" represented by string code i.

When the illustrated characters are shifted into the buffer 10, the AND-gates 14–16 are enabled substantially instantaneously, thereby instantaneously determining that the string residing in buffer stages 1–4 is the longest match to a previously recorded string. The code of the longest match is the largest code corresponding to an enabled AND-gate. As illustrated, the code of the longest matching string is code i and the character "c" in stage 5 is the mismatching character.

An update extended string is recorded by closing the dashed line switch connections to AND-gate 17 corresponding to the next assignable string code. Thus, the recorded update extended string comprises the longest matching string previously recorded by AND-gate 16 extended by the mismatching character. A virtual level is assigned to AND-gate 17 that is one greater than the level assigned to AND-gate 16. As illustrated, the update extended string recorded by AND-gate 17 is "abdbc".

After outputting the code of the longest matching string and recording the update extended string, the input character buffer 10 is shifted so that the mismatching character resides in stage 1 while new characters are entered from the input data character stream. The number of shifts is one plus the virtual level of the AND-gate of the longest matching string. In the preferred embodiments, the assigned virtual levels are from level 1 to level n in consonance with the n+1 stages of the input character buffer 10. The characters in the buffer 10 comprise a string under test with respect to which a longest match determination is effected.

The best mode embodiments described below, utilizing the switched input coincidence element virtual level implementation architecture of the present invention, are predicated, generally, on the LZW methodology. The embodiments are implemented in a manner similar to that described above where the single character strings are considered as recognized by the compressor although not explicitly included therein.

Figure 2:
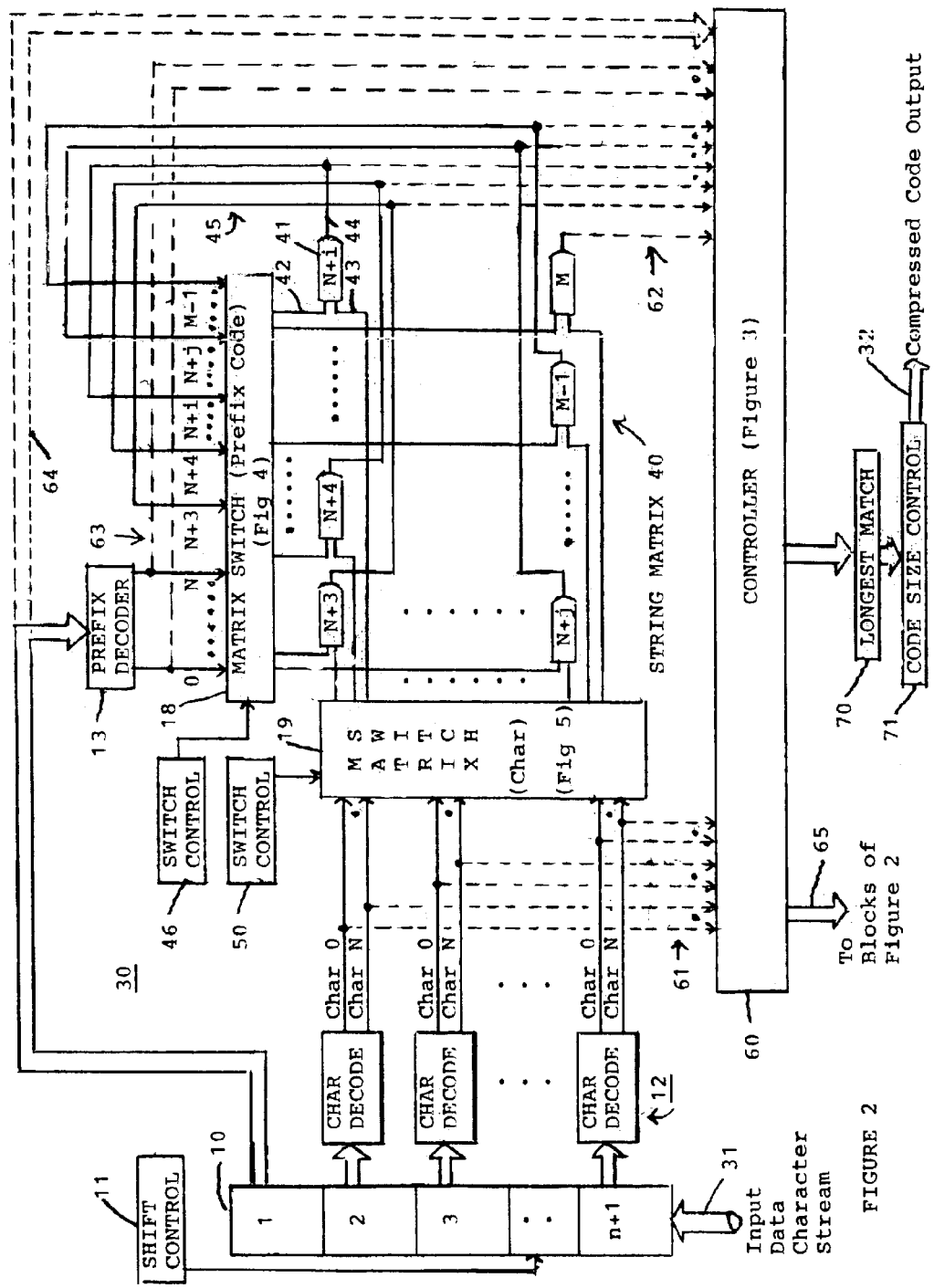
FIG. 2 is a schematic block diagram of a data compressor for compressing data in accordance with the present invention.

Referring to FIG. 2, where like reference numerals indicate like components with respect to FIG. 1, a data compressor 30 is illustrated that compresses a stream of input data characters applied at an input 31 into a stream of corresponding compressed codes at an output 32. Input character buffer 10 is included for holding n+1 consecutive characters from the input 31. Accordingly, the stages of the buffer 10 are denoted as 1 to n+1. By operations to be further described, the compressor 30 determines the longest match of the n+1 characters in the buffer 10 with previously encountered strings recorded in the compressor 30. The shift control circuit 11 controls shifting of the buffer 10 so that new input characters are fetched into the n+1 stage while processed characters are discarded from the first stage.

The stages 2 through n+1 of the input character buffer 10 are coupled to the respective character decoders 12. A character decoder 12 energizes a unique output thereof in accordance with the character held in the input character buffer stage to which the decoder is coupled. The energized output of a character decoder 12 thus provides a representation of the character held in the corresponding stage of the input character buffer 10. When the alphabet over which compression is being performed comprises character values 0–N, the outputs of each character decoder 13 are accordingly denoted as char 0-char N, respectively.

The prefix decoder 13, identical to each of the character decoders 12, is coupled to the first stage of the input character buffer 10 and energizes a unique output in accordance with the character held in the first buffer stage. The prefix decoder 13 provides prefix code representations for single character prefix strings and the prefix decoder outputs are, accordingly, denoted as prefix codes 0 through N. One of the prefix decoder outputs 0 through N is uniquely energized for a single character prefix value held in stage 1 of the buffer 10, thus providing a representation of the single character prefix code.

A string of data characters is comprised of a prefix string of one or more characters followed by an extension character, where the prefix string has a prefix code associated therewith. Single character prefix strings conveniently utilize the character values as the prefix codes. In a manner to be further described, a string is represented in the compressor 30 and has a string code assigned thereto. A string code of N+3 is the first available string code assigned by the compressor 30 and a string code of M is the maximum assignable string code. The codes N+1 and N+2 may be utilized as control codes as is well known.

Typically, LZW data compressors are limited to 4096 string codes. When this limitation is applied to the present embodiments and when in the ASCII environment, the alphabet has an 8 bit character size supporting an alphabet of 256 characters having character values of 0–255. The first available multiple character string code may be 258 with the codes 256 and 257 utilized as control codes In this example, the maximum assignable string code M is 4095.

The compressor 30 further includes a string matrix 40 comprised of a plurality of coincidence elements such as coincidence element 41. In the preferred embodiments of the invention, the coincidence elements 41 are implemented by AND-gates. The AND-gates of the string matrix 40 correspond, respectively, to the assignable string codes N+3 through M as indicated by the legends. In a manner to be further described, an extended string encountered in the input is recorded by an AND-gate and assigned the string code corresponding thereto.

Each AND-gate, such as AND-gate 41, has an input 42 adapted to receive a prefix code representation and an input 43 adapted to receive a character representation. Each AND-gate, such as AND-gate 41, provides a coincidence output 44 that is energized upon coincidental energization of the inputs 42 and 43. Energization of the coincidence output 44 provides a representation of the code corresponding to the AND-gate.

An extended string recorded by an AND-gate has a prefix string with prefix code corresponding to the prefix code representation applied to the input 42 and an extension character corresponding to the character representation applied to the input 43. The code corresponding to the AND-gate is thus assigned to the string recorded thereby. A representation of the string code assigned to the string is provided by energization of the coincidence output 44 of the AND-gate. It is appreciated that the string code of a particular string becomes the code of the prefix of an extended string having the particular string as its prefix. The coincidence outputs of the AND-gates N+3 through M−1, conveying the prefix code representations, are applied to respective leads 45 which are denoted as prefix code representation outputs N+3 through M−1.

Thus, the outputs of the prefix decoder 13 and the prefix code representation outputs of the leads 45 are denoted as prefix code outputs 0 through M−1 with intermediate values N, N+3, N+4, N+i and N+j as illustrated. The codes N+1 and N+2 may be utilized as control codes and are therefore not illustrated as prefix code outputs. Using the above example of the ASCII environment with a maximum of 4096 codes, N will be 255, M will be 4095 with a maximum prefix code M−1 of 4094. The first available code N+3 for assignment to a multiple character string will be 258 and the control codes may be 256 and 257.

The compressor 30 further includes matrix switch 18 with a plurality of inputs and a plurality of outputs. The plurality of inputs of the matrix switch 18 are coupled to the respective prefix code outputs 0 through M−1 of the prefix decoder 21 and the leads 45. The plurality of outputs of the matrix switch 18 are coupled to the respective prefix code inputs of the AND-gates N+3 through M of the string matrix 40. A switch control 46, coupled to the matrix switch 18, controls the matrix switch to selectively couple any one of the matrix switch inputs to one or more of the matrix switch outputs. In this manner, the prefix code outputs of the prefix decoder 13 and the leads 45 are selectively coupled to the prefix code inputs of the AND-gates of the string matrix 40. It is appreciated that a particular matrix switch input can be coupled to the prefix code inputs of more than one of the AND-gates. Further details of the matrix switch 18 will be described with respect to FIG. 4.

The compressor 30 further includes matrix switch 19 with a plurality of inputs and a plurality of outputs. The plurality of inputs of the matrix switch 19 are coupled to respective outputs of the character decoders 12. The plurality of outputs of the matrix switch 19 are coupled to respective character inputs of the AND-gates of the string matrix 40. A switch control 50, coupled to the matrix switch 19, controls the matrix switch to selectively couple any one of the matrix switch inputs to one or more of the matrix switch outputs. In this manner, the char 0 through char N outputs of the respective character decoders 12 are selectively coupled to the character inputs of the AND-gates of the string matrix 40. It is appreciated that a particular output of any of the character decoders 12 can be coupled to the character inputs of more than one AND-gate. Further details of the matrix switch 19 will be described with respect to FIG. 5.

It is appreciated from the above with respect to FIGS. 1 and 2 that the AND-gates 14–17 of FIG. 1 are in the string matrix 40 of FIG. 2, the switches denoted as 18 in FIG. 1 are in the matrix switch 18 of FIG. 2 and the switches denoted as 19 in FIG. 1 are in the matrix switch 19 of FIG. 2.

The compressor 30 includes a controller 60 responsive to control inputs represented as dashed lines. The controller 60 receives control inputs 61 from the char 0 through char N outputs of each of the character decoders 12, control inputs 62 from the coincidence outputs of the AND-gates N+3 through M and control inputs 63 from the prefix code outputs 0 through N of the prefix decoder 13. The character value from the first stage of the input character buffer 10 is also provided to the controller 60 via control input 64. The controller 60 provides control signals to the blocks of FIG. 2 via a bus 65 to control the operations of the compressor 10 in a manner to be described. Further details of the controller 60 are illustrated in FIG. 3.

During each longest match compression cycle, the controller 60 provides the code of a longest matching string to a longest match register 70. The code of the longest matching string is provided to the compressor output 32 through a code size control circuit 71 that is utilized, in a well known manner, to control the number of bits utilized for transmitting the compressed code from the output 32. In an ASCII variable length code implementation, the code size may begin with 9 bits and sequentially increase to 10, 11 and 12 bits at codes 512, 1024 and 2048, respectively. It is appreciated that a fixed code size may also be utilized to implement the embodiments.

Figure 3:
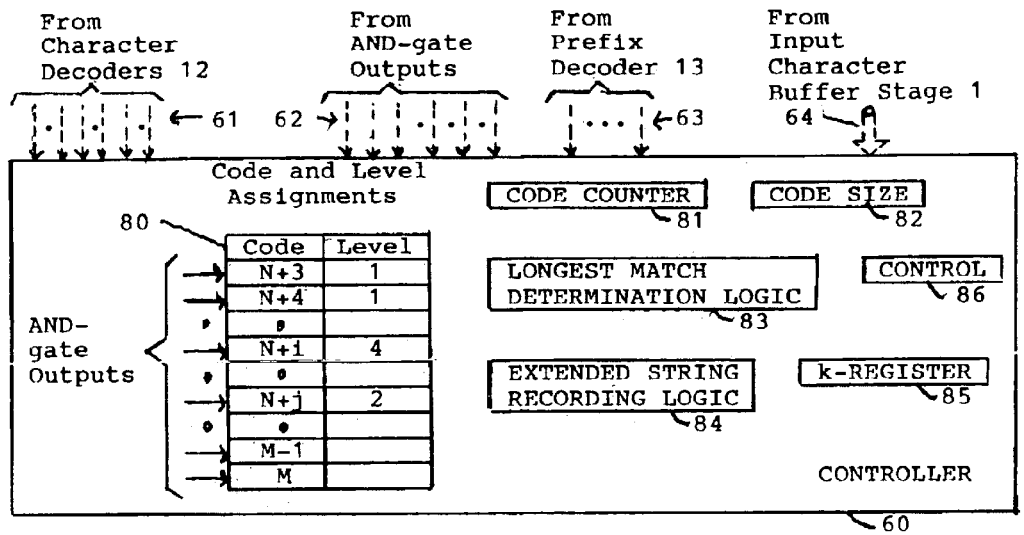
FIG. 3 is a schematic block diagram illustrating details of the controller component of FIG. 2.

Referring to FIG. 3 with continued reference to FIG. 2, where like reference numbers indicate like elements with respect to FIG. 2, details of the controller 60 are illustrated.

The controller 60 includes a code and level assignment table 80 for storing the respective string codes assigned to the AND-gates of the string matrix 40 together with the virtual levels assigned thereto. As illustrated, the code and level assignment table 80 is storing the codes N+3 through M corresponding to the similarly denoted AND-gates together with assigned virtual levels. The coincidence outputs of the AND-gates are coupled via the leads 62 to access the respective locations of the code and level assignment table 80 to provide the code and level stored at an accessed location. The code and level assignment table 80 may be initialized with all of the assignable string codes N+3 through M. Alternatively, the string codes may be stored in the locations of the table when required to be assigned to a string to be recorded at an AND-gate.

The controller 60 includes a code counter 81 for registering the next code to be assigned to a string. The code counter 81 indicates the code corresponding to the next available AND-gate for recording an extended string to be stored. The code counter 81 is initialized to the first available code N+3 and is incremented for each recorded string until the maximum assignable code M is exceeded. Any convenient mechanism such as counter overflow can be utilized to detect that the code counter 81 has exceeded the maximum assignable code. When this occurs the compressor 30 continues to compress input data without recording additional strings until the compressor 30 is reinitialized. At reinitialization, the code counter 81 is reset to the first available string code.

The controller 60 further includes a code size register 82 for determining the number of bits utilized by the code size control 71 for transmitting the compressed codes on the output 32. The code size in the code size register 82 is set in accordance with the count in the code counter 81. The code size is set to an initial value and incremented at predetermined codes of the code counter 81 until a maximum code size is attained. In the ASCII example discussed above, the code size may begin with 9 bits and sequentially increase to 10, 11 and 12 bits at codes 512, 1024 and 2048, respectively.

The controller 60 further includes longest match determination logic 83 and extended string recording logic 84. The logic 83 determines the longest match of the input data character stream held in the input character buffer 10 with a string recorded by an AND-gate of the string matrix 40. The logic 84 records an extended string encountered in the input at a next available AND-gate of the string matrix 40. A k-register 85 utilized by the logic 83 and 84 is included for holding a working parameter "k". During a longest match determination, the parameter k is set equal to the assigned level of an enabled AND-gate with the largest assigned code. The controller 60 also includes control circuit 86 for controlling the detailed operations to be executed by the compressor 30 in accordance with the flow chart diagrams of FIGS. 6–8 to be described. The control circuit 86 is considered as containing appropriate circuitry, such as state machines, or appropriate software to control execution of the operations.

Figure 4:
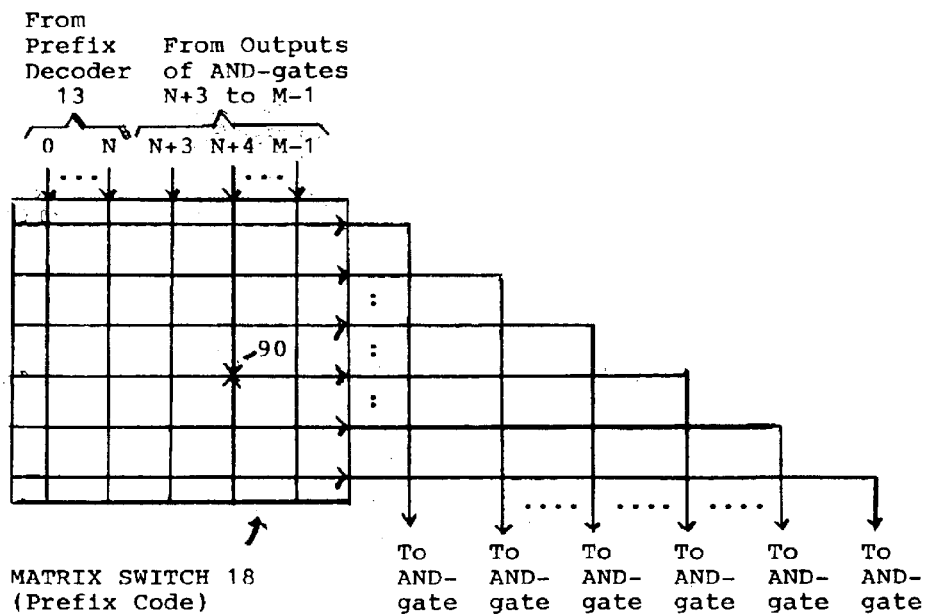
FIG. 4 is a schematic block diagram illustrating details of the prefix code matrix switch component of FIG. 2.

Referring to FIG. 4, where like reference numerals indicate like components with respect to FIG. 2 and with continued reference to FIG. 2, further details of the matrix switch 18 are illustrated. The matrix switch 18 is comprised of columns coupled to the matrix switch inputs and rows coupled to the matrix switch outputs. The columns of the matrix switch receive inputs from the prefix code representation outputs of the prefix decoder 13 and the outputs of AND-gates N+3 to M−1 and the matrix switch rows provide outputs to the prefix code inputs of the AND-gates N+3 to M. Each column and row intersection is a controllable switch connection, such as switch connection 90, actuated by the switch control 46. The switch control 46 is operative for selectively coupling any one of the matrix switch 18 inputs to one or more of the matrix switch outputs. For example, the switch connection 90 connects the prefix code representation output of the AND-gate N+4 to the prefix code input of the AND-gate N+j.

Figure 5:
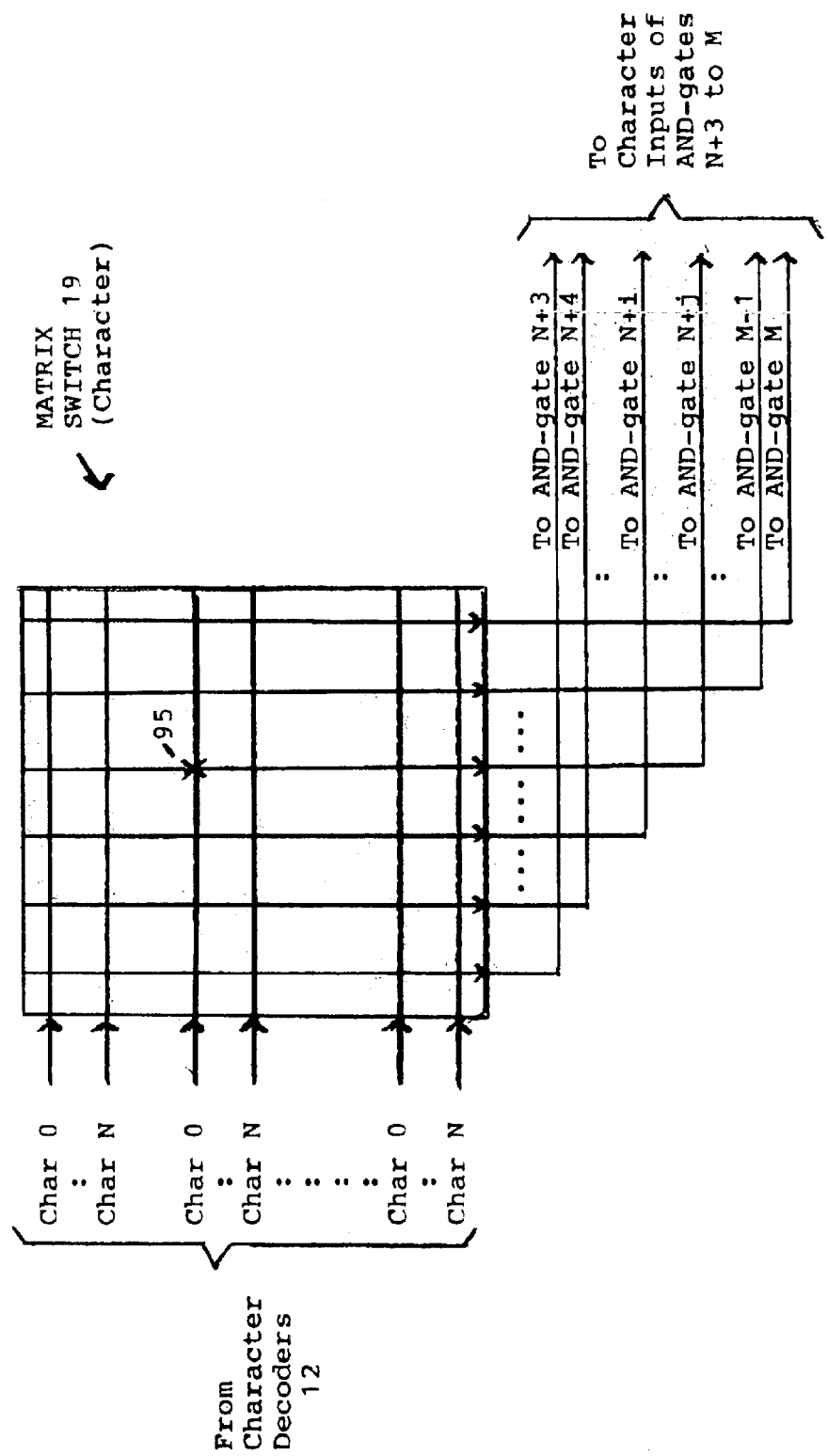
FIG. 5 is a schematic block diagram illustrating details of the character matrix switch component of FIG. 2.

Referring to FIG. 5, where like reference numerals indicate like components with respect to FIG. 2 and with continued reference to FIG. 2, further details of the matrix switch 19 are illustrated. The matrix switch 19 is comprised of rows coupled to the matrix switch inputs and columns coupled to the matrix switch outputs. The matrix switch rows receive inputs from the character representation outputs of the character decoders 12 and the matrix switch columns provide outputs to the character inputs of the AND-gates N+3 to M. Each row and column intersection is a controllable switch connection, such as the switch connection 95, actuated by the switch control 50. The switch control 50 is operative for selectively coupling any one of the matrix switch inputs to one or more of the matrix switch outputs. For example, the char 0 output from the character decoder 12 that is coupled to stage 3 of the input character buffer 10 is coupled through the switch connection 95 to the character input of AND-gate N+j.

With continued reference to FIGS. 2–5, it is appreciated that with the switch connections 90 and 95 illustrated in FIGS. 4 and 5, the AND-gate N+j is recording the extended string having a prefix string with code N+4 and an extension character of char 0.

Briefly, the operation of the compressor 30 is as follows. With n+1 characters fetched from the input stream into the input character buffer 10, the compressor 30 determines the code of the longest string in the buffer 10 that matches a previously encountered string recorded in the string matrix 40 where the first character of the string in the buffer 10 resides in buffer stage 1.

If the character in buffer stage 1 had not previously been encountered therein, the longest match is the single character string comprising the character in buffer stage 1. The controller 60 detects this condition by examining the AND-gate outputs 62 determining that none of the AND-gates are enabled. The character value from buffer stage 1, applied to the controller 60 via bus 64, is transferred to the longest match register 70 as the code of the longest matching string.

An appropriate update string is recorded in the next available AND-gate corresponding to the string code in code counter 81. Accordingly, switch connections are established by the switch control 46 and the switch control 50 in the respective matrix switches 18 and 19 coupling the prefix code input of the AND-gate corresponding to the string code in code counter 81 to the energized output of the prefix decoder 13 and coupling the character input of the AND-gate to the energized output of the character decoder coupled to stage 2 of the input character buffer 10.

The AND-gate corresponding to the string code in code counter 81 is assigned virtual level 1 by storing the level 1 indication in the code and level assignment table 80 at the location corresponding to the code in code counter 81. The code counter 81 is incremented by one and the input character buffer 10 is shifted one time by shift control 11 entering one new character from the input.

If the longest matching string in the input character buffer 10 is a multiple character string, the controller 60 detects this condition by examining the AND-gate outputs 62 determining that at least one AND-gate is enabled. The code of the longest matching string is the code assigned to the enabled AND-gate with the largest corresponding code and the code is transferred to the longest match register 70. For convenience, a working parameter k is set in the k-register 85 to the level assigned to the AND-gate with the largest corresponding code.

An appropriate update string is recorded in the next available AND-gate corresponding to the string code in code counter 81. Accordingly, switch connections are established by the switch control 46 and the switch control SO in the respective matrix switches 18 and 19 coupling the prefix code input of the AND-gate corresponding to the string code in code counter 81 to the output of the energized level k AND-gate and coupling the character input of the AND-gate corresponding to the string code in code counter 81 to the energized output of the character decoder coupled to stage k+2 of the input character buffer 10.

The AND-gate corresponding to the string code in code counter 81 is assigned virtual level k+1 by storing the level k+1 indication in the code and level assignment table 80 at the location corresponding to the code in code counter 81. The code counter 81 is incremented by one and the input character buffer 10 is shifted k+1 times by shift control 11 entering k+1 new characters from the input.

Figure 6:
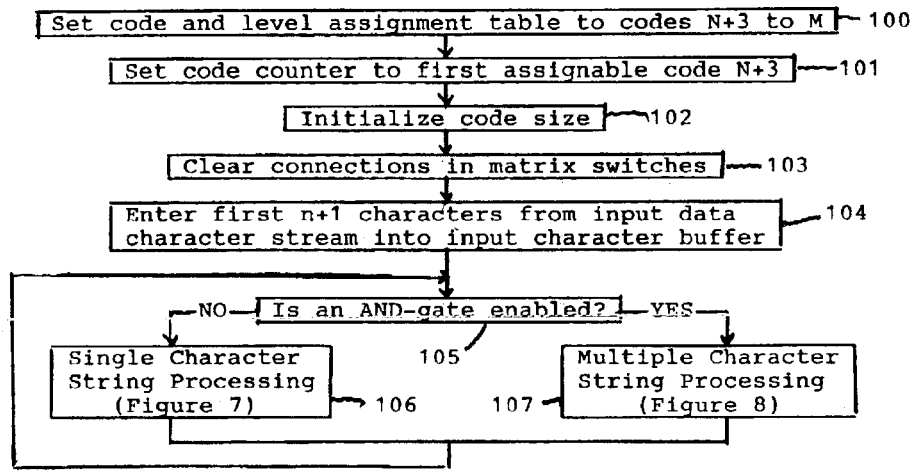
FIG. 6 is a control flow chart illustrating the operations executed by the compressor of FIG. 2 so as to perform data compression in accordance with the present invention.

Referring to FIG. 6, with continued reference to FIGS. 2–5, a control flow chart is illustrated showing the flow of operations to be executed by the compressor 30. The control 86 in the controller 60 is considered as containing appropriate circuitry, such as state machines, to control execution of the operations.

At a block 100, the code fields of the locations of the code and level assignment table 80 are set to respective codes N+3 to M and at a block 101, the code counter 81 is set to the first assignable code N+3. Since the codes N+3 to M are sequentially assigned to strings encountered in the input, all of the codes may initially be set into the respective locations of the code and level assignment table 80. Alternatively, the codes may be sequentially set into the code field of the table locations from the code counter 81 when required. The level fields of the locations of the table 80 may be cleared, but this is not required since the level fields are overwritten when used.

At a block 102, the code size register 82 is initialized to the beginning code size, for example, 9 bits in ASCII embodiments. At a block 103, utilizing the switch controls 46 and 50, all of the connections in the matrix switches 18 and 19 are opened. At a block 104, utilizing the shift control 11, the first n+1 characters from the input 31 are shifted into the input character buffer 10.

At a block 105, the longest match determination logic 83 in the controller 60 tests the control inputs 62 to determine if an AND-gate output is energized. If at the block 105 an AND-gate is not enabled, the NO branch is taken from the block 105 to a block 106 to perform single character string processing. Details of the processing of block 106 are described below with respect to FIG. 7. If at the block 105 at least one AND-gate is enabled, the YES branch is taken from the block 105 to a block 107 to perform multiple character string processing. Details of the processing of block 107 are described below with respect to FIG. 8.

In each of the blocks 106 and 107 a longest match code is output, an update string is recorded in the string matrix 40 and the input character buffer 10 is replenished with new data to be tested. The blocks 106 and 107 return to the block 105 to begin the next longest match cycle of the compressor 30.

Figure 7:
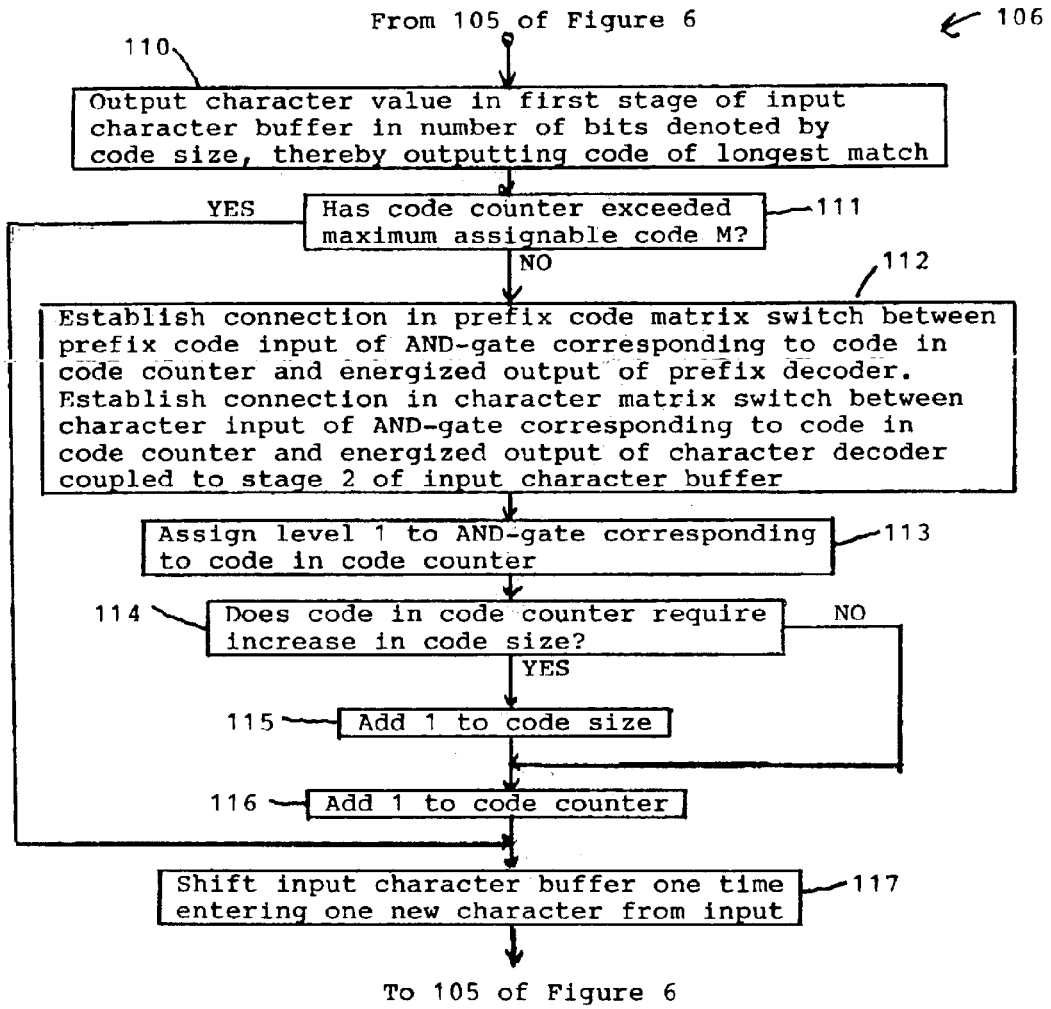
FIG. 7 is a control flow chart illustrating details of the single character string processing of FIG. 6.

Referring to FIG. 7, with continued reference to FIGS. 2–6, details of the single character string processing of block 106 of FIG. 6 are illustrated. Control enters a block 110 from the NO branch of block 105. At the block 110 the character value in the first stage of the input character buffer 10 is output thereby outputting the code of the longest match. The character value is output in the number of bits controlled by the code size register 82 and is transferred by the controller 60 from the bus 64 to the longest match register 70 to provide the compressed code output at the output 32 of the compressor 30.

Control proceeds from the block 110, to a block 111 whereat the controller 60 determines if any codes remain available to be assigned to encountered strings. This may be done, for example, by determining if the code counter 81 has exceeded the maximum assignable code M.

If a next code is available to be assigned, control proceeds via the NO branch of the block 111 to a block 112 whereat the extended string recording logic 84 records an appropriate update extended string in an AND-gate of the string matrix 40. Accordingly, the controller 60, via the switch control 46, establishes the connection in the matrix switch 18 between the prefix code input of the AND-gate corresponding to the code in the code counter 81 and the energized output of the prefix decoder 13. The controller 60 also, via the switch control 50, establishes the connection in the matrix switch 19 between the character input of the AND-gate corresponding to the code in the code counter 81 and the energized output of the character decoder 12 coupled to stage 2 of the input character buffer 10. .By the processing of block 112, the next available code is assigned to the two-character extended string whose prefix is the single character string from stage 1 of the input character buffer 10 and whose extension character is resident in stage 2 of the input character buffer 10. This extended string is thereby recorded in the AND-gate corresponding to the next available code.

At a block 113, the virtual level 1 is assigned to the AND-gate corresponding to the code in the code counter 81 by storing the level 1 indication in the level field of the location in the code and level assignment table 80 that corresponds to the code in the code counter 81.

Control proceeds from the block 113 to a block 114 whereat the code in the code counter 81 is tested to determine if an increase in code size is required. If so, control continues to a block 115 whereat the code size register 82 is incremented by 1. If an increase in code size is not required at the block 114, the block 115 is bypassed to continue the operations at a block 116. At the block 116, the code counter 81 is incremented by 1. Processing proceeds from the block 116 to a block 117 whereat the input character buffer 10 is shifted one time entering one new character from the input 11. Control returns from the block 117 to the block 105 of FIG. 6 to process the new character string in the buffer.

If, at the block 111, the code counter 81 has exceeded the maximum assignable code M, control proceeds directly from the block 111 to the block 117 bypassing the operations of blocks 112–116. It is appreciated that after the maximum code M has been assigned to a string, advancing the code counter 81 is terminated and no further extended strings are recorded. The compressor 30 continues to compress input data utilizing the already recorded strings until the compressor is cleared by returning to block 100 of FIG. 6.

Figure 8:
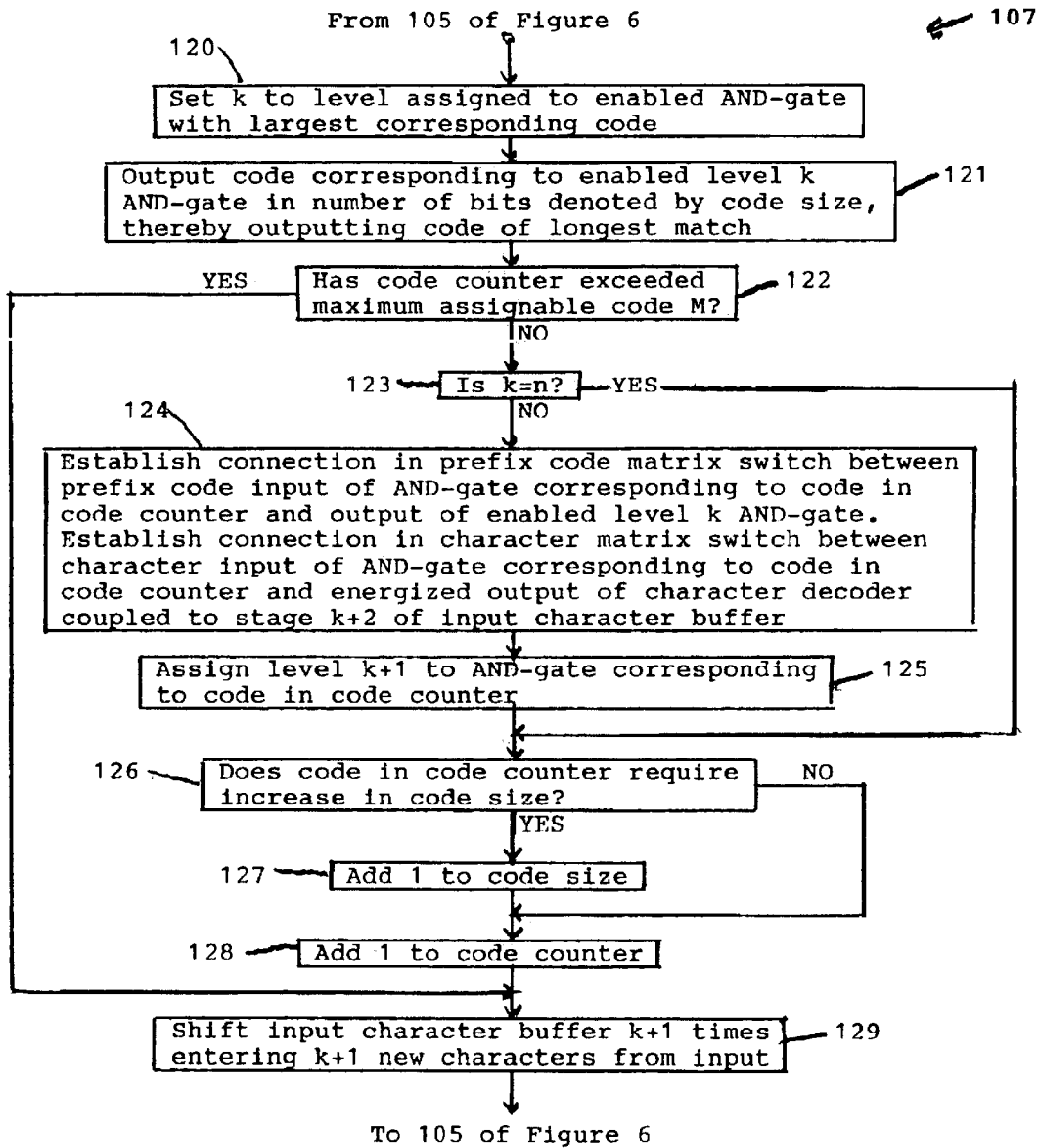
FIG. 8 is a control flow chart illustrating details of the multiple character string processing of FIG. 6.

Referring to FIG. 8, with continued reference to FIGS. 2–6, details of the multiple character string processing of block 107 of FIG. 6 are illustrated. Control enters a block 120 from the YES branch of block 105 of FIG. 6.

At the block 120, the working parameter k in the k-register 85 is set to the level assigned to the enabled AND-gate with the largest corresponding code. The processing of block 120 is effected utilizing the control inputs 62 to the controller 60 from the AND-gate outputs and the code and level assignment table 80. The outputs of the enabled AND-gates access the corresponding locations in the table 80 and the parameter k is taken from the level stored in the level field of the accessed location with the largest stored code.

Alternatively, it is appreciated that k is the highest level assigned to the enabled AND-gates and is the level assigned to the enabled AND-gate with the largest corresponding code. Thus, the parameter k may also be taken from the level stored in the level field of the accessed locations containing the highest level.

Processing continues with the block 121 whereat the code corresponding to the enabled level k AND-gate is output thereby outputting the code of the longest match. The code is output in the number of bits controlled by the code size register 82 and is transferred by the controller 60 to the longest match register 70 to provide the compressed code output at the output 32 of the compressor 30. The code is provided from the code field of the accessed location of the table 80 with the largest code as determined in block 120. It is appreciated that the longest matched string resides in stages 1 through k+1 of the input character buffer 10.

Control proceeds from the block 121 to a block 122 whereat the controller 60 determines if any codes remain available to be assigned to encountered strings. This may be done, for example, by determining if the code counter 81 has exceeded the maximum assignable code M.

If a next code is available to be assigned, control proceeds via the NO branch of the block 122 to a block 123 whereat the parameter k is tested to determine if k is equal to n. If k is not equal to n, the NO branch from the block 123 is taken to a block 124.

At the block 124, the extended string recording logic 84 records an appropriate update extended string in an AND-gate of the string matrix 40. Accordingly, the controller 60, via the switch control 46, establishes the connection in the matrix switch 18 between the prefix code input of the AND-gate corresponding to the code in the code counter 81 and the output of the enabled level k AND-gate. The controller 60 also, via the switch control 50, establishes the connection in the matrix switch 19 between the character input of the AND-gate corresponding to the code in the code counter 81 and the energized output of the character decoder 12 coupled to stage k+2 of the input character buffer 10.

By the processing of block 124, the next available code is assigned to the multiple character extended string whose prefix is represented by the output of the enabled level k AND-gate and whose extension character is resident in stage k+2 of the input character buffer 10. The string prefix is the longest matching string resident in stages 1 through k+1 of the input character buffer 10. This extended string is thereby recorded in the AND-gate corresponding to the next available code.

At a block 125, the virtual level k+1 is assigned to the AND-gate corresponding to the code in the code counter 81 by storing the level k+1 indication in the level field of the location in the code and level assignment table 80 that corresponds to the code in the code counter 81.

Control proceeds from the block 125 to blocks 126–128 whereat processing is performed identical to that of the blocks 114–116 described above with respect to FIG. 7. Processing proceeds from the block 128 to a block 129 whereat the input character buffer 10 is shifted k+1 times entering k+1 new characters from the input 11. Control returns from the block 129 to the block 105 of FIG. 6 to process the new character string in the buffer.

If, at the block 122, the code counter 81 has exceeded the maximum assignable code M, control proceeds directly from the block 122 to the block 129 bypassing the operations of blocks 123–128. It is appreciated that after the maximum code M has been assigned to a string, advancing the code counter 81 is terminated and no further extended strings are recorded. The compressor 30 continues to compress input data utilizing the already recorded strings until the compressor is cleared by returning to block 100 of FIG. 6.

If, at the block 123, k is equal to n, control proceeds via the YES branch of the block 123 directly to the block 126 bypassing the processing of the blocks 124 and 125. As an alternative mode of operation, the YES branch of the block 123 may instead be taken directly to the block 129 additionally bypassing the blocks 126–128. When this alternative mode protocol is utilized, the code counter 81 is not advanced to a next available code and provision should be included at a decompressor to maintain synchronism with the compressor 30.

Figure 9:
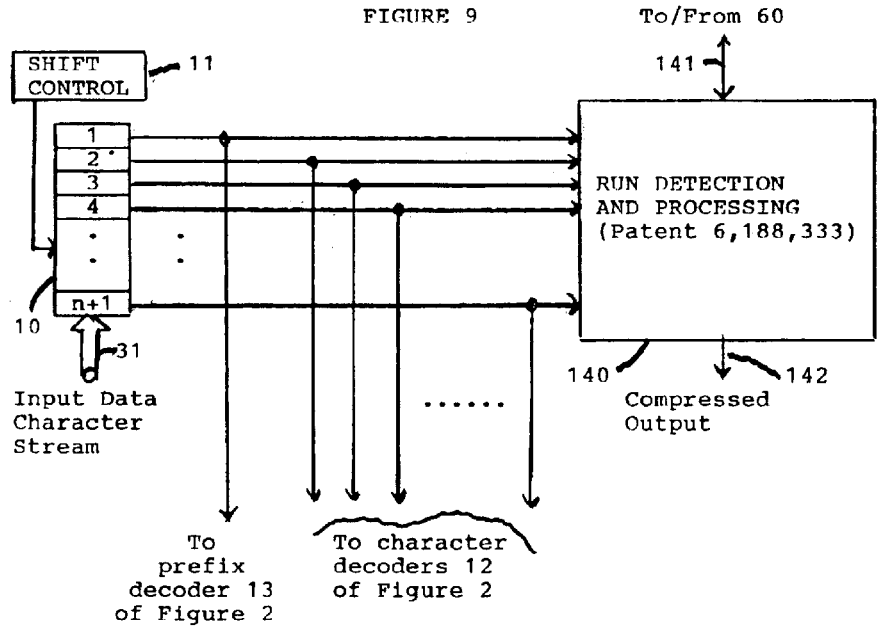
FIG. 9 is a schematic block diagram of an addition to the embodiment of FIG. 2 for providing enhanced processing of data character runs.

Referring to FIG. 9, where like reference numerals indicate like components with respect to FIG. 2 and with continued reference to FIG. 2, an addition to FIG. 2 for providing enhanced processing of data character runs is illustrated. A block 140 schematically represents the run detection and processing of the compressor of said U.S. Pat No. 6,188,333 which is incorporated herein in its entirety. The compression apparatus of the block 140 communicates with the controller 60 via a bus 141 and provides compressed codes at an output 142. The compressor 140 utilizes the input buffer 10 and the shift control 11 to provide the input look-ahead data required by the apparatus 140. In the embodiment of FIG. 9, data character runs are processed by the apparatus 140 while non-run input data is processed by the above-described embodiment of FIG. 2.

It is appreciated from the above that in a longest match compression cycle of FIG. 8, one or more AND-gates are enabled with one AND-gate enabled at each consecutive virtual level beginning with level 1. An AND-gate with virtual level k represents a string having k+1 characters with a k character prefix and an extension character from stage k+1 of the input buffer.

Although the above embodiments of the present invention are explained in terms of the matrix switches 18 and 19, other coupling arrangements may alternatively be utilized to effect the above described connections.

It is appreciated that the embodiments of the present invention do not utilize a dictionary or string table for storing and searching previously encountered strings thereby eliminating the disadvantages, such as hash or sibling list searching, that are attendant prior art designs.

It is appreciated that the compressed code output provided by the above-described embodiments is compatible with standard LZW decompressors and the data character stream corresponding to the compressed code can be recovered thereby. Furthermore, although the above disclosed embodiments are described utilizing LZW data compression protocols, it is appreciated that the architecture of the present invention can be readily utilized with other data compression protocols such as, for example, LZ2.

The embodiments of the present invention are substantially universal with respect to alphabet size. With N as the largest character value in an N+1 character alphabet, smaller alphabets are accommodated by adjusting the codes stored in the code and level assignment table 80. For example, if N is 255 in an ASCII alphabet, the first assignable code N+3 may be 258. If N is 3 in a 4 character alphabet, the first assignable code N+3 may be 6. Of course a sufficient number of AND-gates should be included in the design to accommodate the assignable codes.

In selecting the number of stages in which to implement the input character buffer 10, the statistics of the input data can be analyzed to choose an appropriate number of stages so as to optimize performance. The number of stages can be chosen so that there will usually be a mismatching character in the buffer so that an extended string can be recorded in the string matrix 40. The number of virtual levels should be consistent with the length of the input buffer.

It is further appreciated that the input data characters can be over any size alphabet having any corresponding character bit size. For example, the data characters can be textual data, image pixel data or bit map data. The input data can also be binary characters over the two-character binary alphabet 1 and 0 having a 1-bit size character.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. Data compression apparatus for compressing an input stream of data characters into an output stream of compressed codes, comprising a plurality of coincidence elements corresponding to a respective plurality of string codes to be assigned to strings, a string being comprised of a prefix string of at least one of said data characters followed by an extension character, a prefix string having a prefix code associated therewith, a coincidence element providing a coincidence output and having a prefix code input and a character input for enabling the coincidence element to energize the coincidence output thereof upon coincidental energization of the prefix code input and character input thereof so that energization of the coincidence output of the coincidence element provides a representation of the string code corresponding to the coincidence element, first coupling means for selectively coupling the representations of the string codes corresponding to the coincidence elements to the prefix code inputs of the coincidence elements, second coupling means for selectively coupling representations of data characters fetched from said input stream to the character inputs of the coincidence elements, means for fetching a plurality of said data characters from said input stream and applying said fetched characters to said second coupling means so as to enable the coincidence element corresponding to the string code assigned to the string that is a longest matching string to said fetched plurality of data characters, and means for outputting the string code assigned to said longest matching string, thereby providing said output stream of compressed codes.

2. The apparatus of claim 1 wherein said first coupling means comprises means for coupling the representation of the string code assigned to said longest matching string to the prefix code input of the coincidence element corresponding to a next string code to be assigned to a string, and said second coupling means comprises means for coupling the representation of the fetched data character following said longest matching string to the character input of said coincidence element corresponding to said next string code, so as to record, in said coincidence element corresponding to said next string code, an extended string comprising a prefix string having the string code assigned to said longest matching string and an extension character comprising said data character following said longest matching string, thereby assigning said next string code to said extended string.

3. The apparatus of claim 2 wherein a string is comprised of a number of characters, said apparatus further including means for assigning levels to said coincidence elements, a level assigned to a coincidence element being indicative of the number of characters of a string recorded thereby, the level assigned to said coincidence element corresponding to said next string code being one level greater than the level assigned to said coincidence element corresponding to said longest matching string.

4. The apparatus of claim 3 wherein said means for fetching comprises an input buffer for holding said plurality of data characters fetched from said input stream, the level assigned to the coincidence element corresponding to said longest matching string being indicative of the stage of said input buffer holding said fetched data character following said longest matching string.

5. The apparatus of claim 1 wherein a string is comprised of a number of characters, said apparatus further including means for assigning levels to said coincidence elements, a level assigned to a coincidence element being indicative of the number of characters of a string corresponding thereto.

6. The apparatus of claim 5 wherein said means for assigning levels includes a code and level assignment table having locations for storing the string codes corresponding to said coincidence elements and the levels assigned thereto, each of said locations being accessed by the coincidence output of the corresponding coincidence element.

7. The apparatus of claim 1 wherein said plurality of coincidence elements comprises a matrix of coincidence elements.

8. The apparatus of claim 1 wherein said plurality of coincidence elements comprises a plurality of AND-gates.

9. The apparatus of claim 1 wherein said first coupling means comprises prefix code switch means for selectively coupling the coincidence outputs of the coincidence elements to the prefix code inputs thereof.

10. The apparatus of claim 9 wherein said prefix code switch means comprises a matrix switch.

11. The apparatus of claim 9 wherein said first coupling means further includes a code decoder responsive to a first character of a string under test for providing a plurality of outputs corresponding to respective character values, a unique decoder output being energized in accordance with the character value of said first character, said outputs of said code decoder providing representations of codes corresponding to said character values to said prefix code switch means.

12. The apparatus of claim 1 wherein said second coupling means includes character switch means for selectively coupling said representations of data characters to the character inputs of the coincidence elements.

13. The apparatus of claim 12 wherein said character switch means comprises a matrix switch.

14. The apparatus of claim 12 wherein said data characters are from an alphabet of data characters and wherein said second coupling means includes a plurality of character decoder responsive respectively to said plurality of fetched characters, each character decoder providing a plurality of outputs corresponding to the respective characters of said alphabet, a unique decoder output being energized in accordance with the character applied to the character decoder, the outputs of said plurality of character decoders providing said representations of data characters to said character switch means.

15. The apparatus of claim 14 wherein said means for fetching comprises an input buffer for holding said plurality of data characters fetched from said input stream and for applying said fetched characters to said character decoders, respectively, and means for shifting said plurality of data characters in said input buffer so that the fetched data character following said longest matching string is shifted to a first stage of said input buffer so as to provide the first character of a next longest match.

16. The apparatus of claim 15 wherein said shifting means is operative to shift new data characters from said input stream into said input buffer.

17. The apparatus of claim 1 wherein said means for fetching comprises an input buffer for holding said plurality of data characters fetched from said input stream and for applying said fetched characters to said second coupling means, said compression apparatus further including run detection and processing means responsive to the data characters held in said input buffer for detecting a data character run in said input stream and providing an output stream of compressed codes corresponding to said run.

18. A data compression method for compressing an input stream of data characters into an output stream of compressed codes, comprising providing a plurality of coincidence elements corresponding to a respective plurality of string codes to be assigned to strings, a string being comprised of a prefix string of at least one of said data characters followed by extension character, a prefix string having a prefix code associated therewith, a coincidence element providing a coincidence output and having a prefix code input and a character input for enabling the coincidence element to energize the coincidence output thereof upon coincidental energization of the prefix code input and character input thereof so that energization of the coincidence output of the coincidence element provides a representation of the string code corresponding to the coincidence element, selectively coupling, through first coupling means, the representations of the string codes corresponding to the coincidence elements to the prefix code inputs of the coincidence elements, selectively coupling, through second coupling means, representations of data characters fetched from said input stream to tho character inputs of the coincidence elements, fetching a plurality of said data characters from said input stream and applying said fetched characters to said second coupling means so as to enable coincidence element corresponding to the string code assigned to the string that is a longest matching string to said fetched plurality of data characters, and outputting the string code assigned to said longest matching string, thereby providing said output stream of compressed codes.

19. The method of claim 18 further including coupling, through said first coupling means, the representation of the string code assigned to said longest matching string to the prefix code input of the coincidence element corresponding to a next string code to be assigned to a string, and coupling, through said second coupling means, the representation of the fetched data character following said longest matching string to the character input of said coincidence element corresponding to said next string code, so as to record, in said coincidence element corresponding to said next string code, an extended string comprising a prefix string having the string code assigned to said longest matching string and an extension character comprising said data character following said longest matching string, thereby assigning said next string code to said extended string.

20. The method of claim 19 wherein a string is comprised of a number of characters, said method further including assigning levels to said coincidence elements, a level assigned to a coincidence element being indicative of the number of characters of a string recorded thereby, the level assigned to said coincidence element corresponding to said next string code being one level greater than the level assigned to said coincidence element corresponding to said longest matching string.

21. The method of claim 20 wherein said fetching step includes utilizing an input buffer for holding said plurality of data characters fetched from said input stream, the level assigned to the coincidence element corresponding to said longest matching string being indicative of the stage of said input buffer holding said fetched data character following said longest matching string.

22. The method of claim 18 wherein a string is comprised of a number of characters, said method further including assigning levels to said coincidence elements, a level assigned to a coincidence element being indicative of the number of characters of a string corresponding thereto.

23. The method of claim 18 wherein the step of providing said plurality of coincidence elements comprises providing a plurality of AND-gates.

\* \* \* \* \*